United States Patent
Lin (10) Patent No.: US 8,189,402 B2
(45) Date of Patent: May 29, 2012

(54) SENSING CIRCUIT FOR MEMORY CELL SUPPLIED WITH LOW POWER

(75) Inventor: Yih-Lang Lin, Taipei (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 231 days.

(21) Appl. No.: 12/817,175

(22) Filed: Jun. 16, 2010

(65) Prior Publication Data

US 2011/0310678 A1    Dec. 22, 2011

(51) Int. Cl.
  *G11C 7/06* (2006.01)
(52) U.S. Cl. ........... 365/189.07; 365/210.1; 365/189.15; 365/203
(58) Field of Classification Search ............. 365/189.07, 365/210.1, 189.15, 185.21, 203
See application file for complete search history.

(56) References Cited

U.S. PATENT DOCUMENTS

| 5,013,943 | A * | 5/1991 | Hirose | 327/51 |
| 6,490,199 | B2 * | 12/2002 | Lee et al. | 365/185.21 |
| 6,608,787 | B1 * | 8/2003 | Daga et al. | 365/203 |
| 7,636,264 | B2 * | 12/2009 | Fort | 365/189.15 |

* cited by examiner

*Primary Examiner* — Alexander Sofocleous
*Assistant Examiner* — Hai Pham
(74) *Attorney, Agent, or Firm* — Winston Hsu; Scott Margo (57) ABSTRACT

An output current of a memory cell is sensed by a sensing circuit for distinguishing a program state and an erase state of the memory cell. The sensing circuit includes a reference transistor, a P-type MOSFET, and an N-type MOSFET. The P-type MOSFET has a gate connected to a memory cell for receiving an output current of the memory cell. The N-type MOSFET has a drain connected to a drain of the first P-type MOSFET, and has a source connected to ground. The inverter has an input terminal connected to the drain of the first N-type MOSFET. The voltage at an output terminal of the inverter is used for indicating the program state or the erase state of the memory cell. The reference transistor has a gate connected to a reference signal, and has a drain connected to the gate of the P-type MOSFET.

4 Claims, 7 Drawing Sheets

SENSING CIRCUIT FOR MEMORY CELL SUPPLIED WITH LOW POWER

BACKGROUND OF THE INVENTION

1. Field of the Invention

The claimed invention discloses a sensing circuit, and more particularly, to a sensing circuit for a memory cell supplied with low power.

2. Description of the Prior Art

In a conventional memory cell, a stored bit is programmed or erased so that the memory cell can be used for consecutively storing different bits. The memory cell has a program state for programming the stored bit and an erase state for erasing the stored bit from the memory cell. Under a program state of the memory cell, an output current of the memory cell is higher, whereas under the erase state of the memory cell, the output current of the memory cell is lower. Note that the output current of the memory cell is highly-related to a cross voltage of the memory cell. For accurately reading the stored bit from the memory cell under both the programming state and the erasing state, a latch-type circuit is designed for sensing the output current of the memory cell so as to distinguish the program state from the erase state.

For distinguishing the program state from the erase state, transition of the program state and the erase state of the memory cell has to be carefully handled. The latch-type circuit outputs different digital signals respectively corresponding to the program state and the erase state according to two different levels of voltages.

Figure 1:
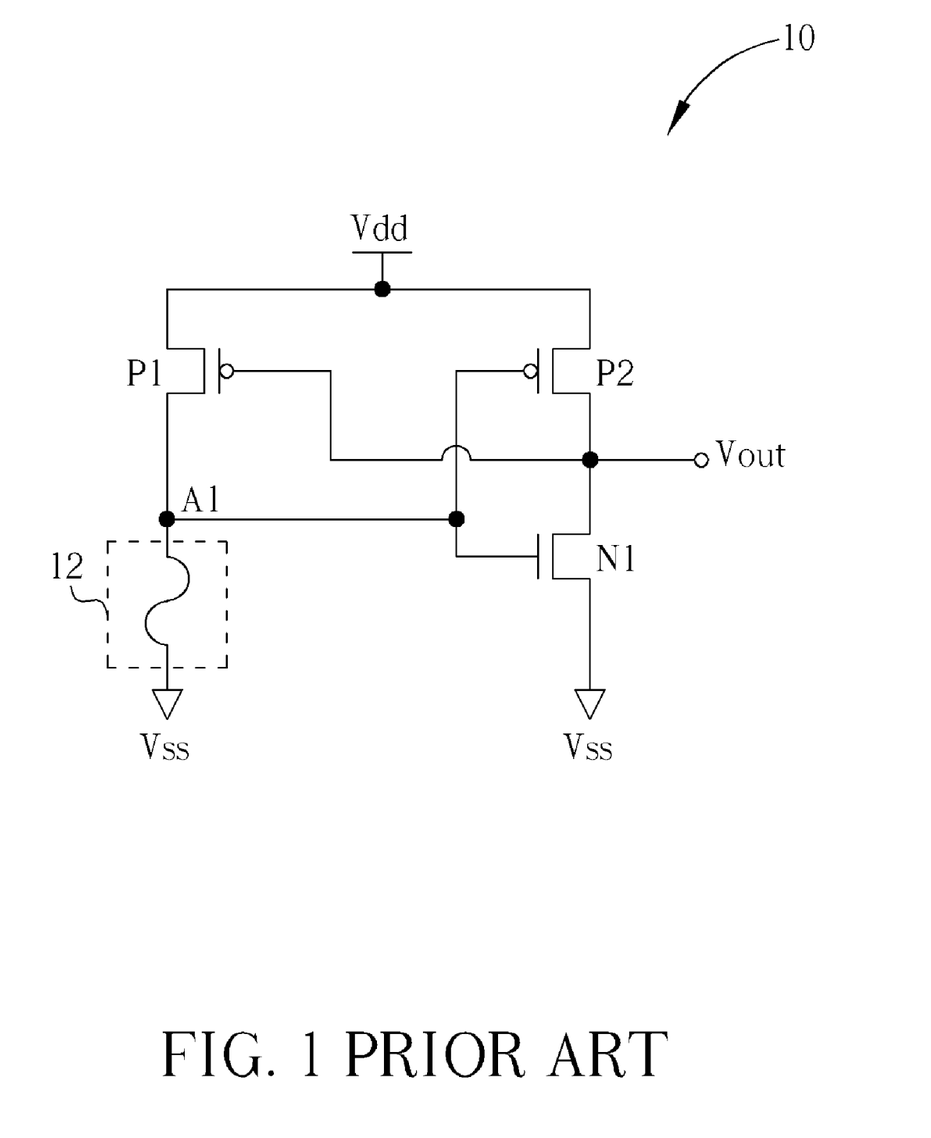
FIG. 1 and FIG. 2 illustrate conventional latch-type circuits for telling the program state and the erase state for a memory cell.

Please refer to FIG. 1, which illustrates a conventional latch-type circuit 10 for telling the program state and the erase state for a memory cell. As shown in FIG. 1, latch-type circuit 10 includes a first P-type transistor P1, a second P-type transistor P2, a fuse 12, and an N-type transistor N1. A node A1, which is located between a first terminal of the fuse 12 and a drain of the first P-type transistor P1, is connected to an output terminal of a memory cell, which is not illustrated in FIG. 1, for sensing an output current of the memory cell so as to recognize the program state and the erase state of the memory cell. While the memory cell is under the erase state, the fuse 12 is open-circuited so that the first N-type transistor N1 is switched on, and the second P-type transistor P2 is switched off. Therefore, an output voltage Vout at the drain of the first N-type transistor is low to indicate the erase state. Note that the fuse 12 may have its resistance. While the memory cell is then transited from the erase state to the program state, the fuse 12 is short-circuited so that the first N-type transistor N1 is switched off, and the second P-type transistor P2 is switched on. Therefore, the output voltage Vout is high to indicate the program state.

Assume that the second P-type transistor P2 has an threshold voltage Vthp, therefore, while the fuse 12 is short-circuited under the erase state and the memory cell is going to be transited to the program state, the voltage at the node A1 has to be lower than (Vdd-Vthp) for switching on the second P-type transistor P2. For a conventional memory cell, getting a voltage at the node A1 with a magnitude lower than (Vdd-Vthp) is easy, however, for memory cells having significantly smaller scales, the supplied power Vdd is getting much lower so that the voltage at the node A1 is barely lower than the voltage difference (Vdd-Vthp); as a result, the second P-type transistor P2 cannot be switched on from the erase state to the program state, and the entire operation of the memory cell may thus fail. In other words, while designing the memory cell, the supplied voltage Vdd meets restrictions in its lower bound, and it is not beneficial in reducing the size of memory cell.

Figure 2:
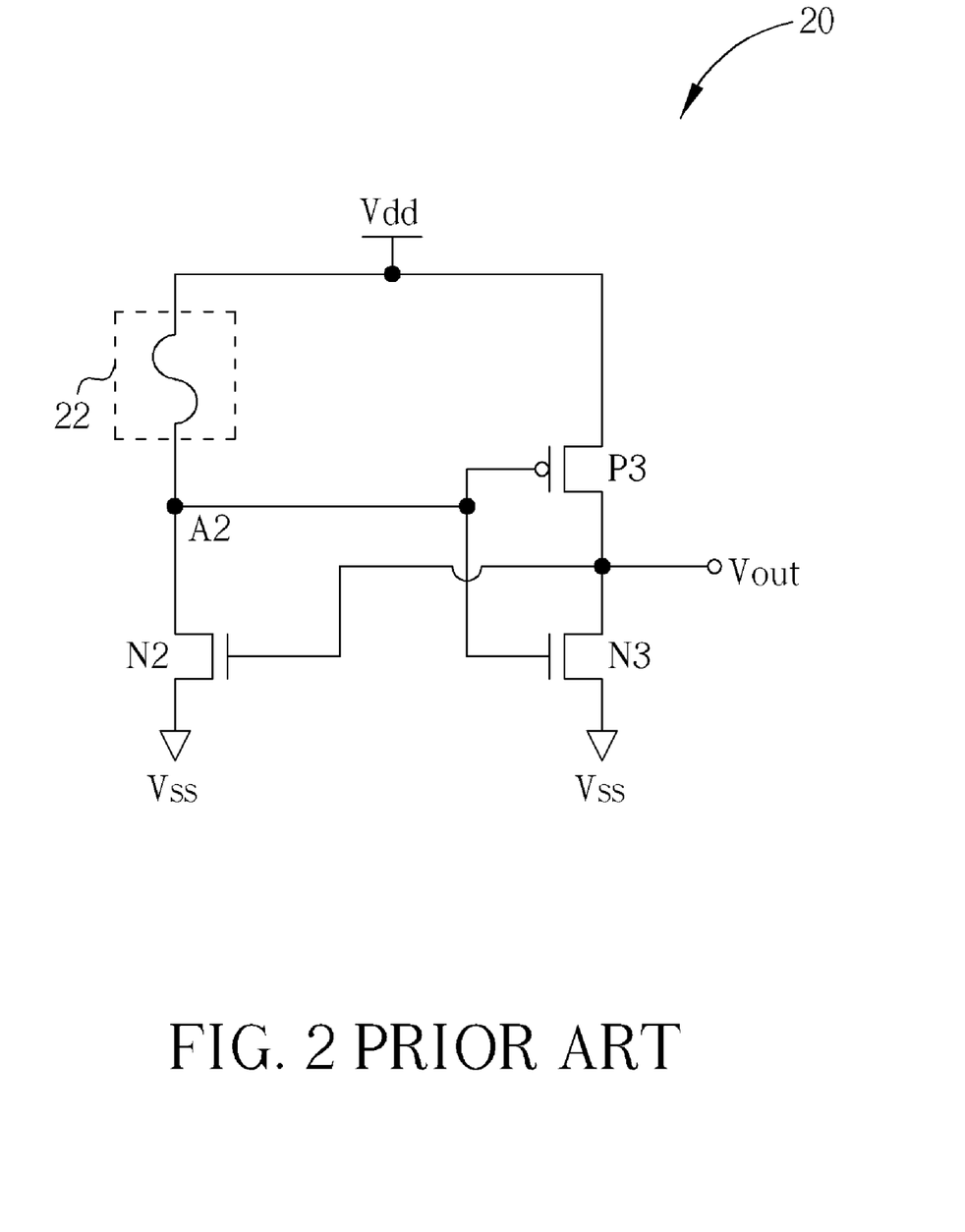

Please refer FIG. 2, which illustrates a conventional latch circuit 20 for distinguishing the program state from the erase state of a memory cell. As shown in FIG. 2, the latch circuit 20 includes a second N-type transistor N2, a third P-type transistor P3, a third N-type transistor N3, and a fuse 22. Similar with the latch-type circuit 10 shown in FIG. 1, a node A2 connected to both a first terminal of the fuse 22 and a drain of the second N-type transistor N2 is connected to the output terminal of the memory cell mentioned in FIG. 1 and is not shown in FIG. 2. Under the program state of the memory cell, the fuse 22 is short-circuited so that a voltage at the node A2 is high, and therefore, the third P-type transistor P3 is switched off whereas the third N-type transistor N3 is switched on; as a result, the voltage Vout is low for indicating the program state of the memory cell. While the memory cell is then transited from the program state to the erase state, the fuse 22 is open-circuited so that the voltage at the node A2 is low so that the third P-type transistor P3 is switched on whereas the third N-type transistor N3 is switched off. A threshold voltage of the third N-type transistor N3 is assumed to be Vthn. Similarly, while the fuse 22 is short-circuited under the erase state and the memory cell is going to be transited to the program state, the voltage at the node A2 has to be higher than Vthn for switching on the third N-type transistor N3; however, if the supplied voltage Vdd is too low because of a reducing scale of the memory cell, the voltage at the node A2 may not be high enough to switch on the third N-type transistor N3, and the erase state cannot be activated from the program state as a result.

SUMMARY OF THE INVENTION

The claimed invention discloses a sensing circuit for a memory cell supplied with low power. The sensing circuit comprises a sensing stage and an inverter. The sensing stage comprises a first P-type MOSFET and a first N-type MOSFET. The first P-type MOSFET has a gate connected to a memory cell for receiving an output current of the memory cell. The first N-type MOSFET has a drain connected to a drain of the first P-type MOSFET, and having a source connected to ground. The inverter has an input terminal connected to the drain of the first N-type MOSFET. A voltage at an output terminal of the inverter is used for indicating a program state or an erase state of the memory cell. A gate of the first N-type MOSFET is high while a stored bit of the memory cell is read under either the program state or the erase state.

These and other objectives of the present invention will no doubt become obvious to those of ordinary skill in the art after reading the following detailed description of the preferred embodiment that is illustrated in the various figures and drawings.

DETAILED DESCRIPTION

For having the memory cell having a significantly reduced scale and a low supplied voltage to be precisely transited between the program state and the erase state for accurately distinguishing the program state and the erase state of the memory cell, the present invention discloses a sensing circuit for a memory cell supplied with a low voltage to be accurately transited between the program state and the erase state.

Figure 3:
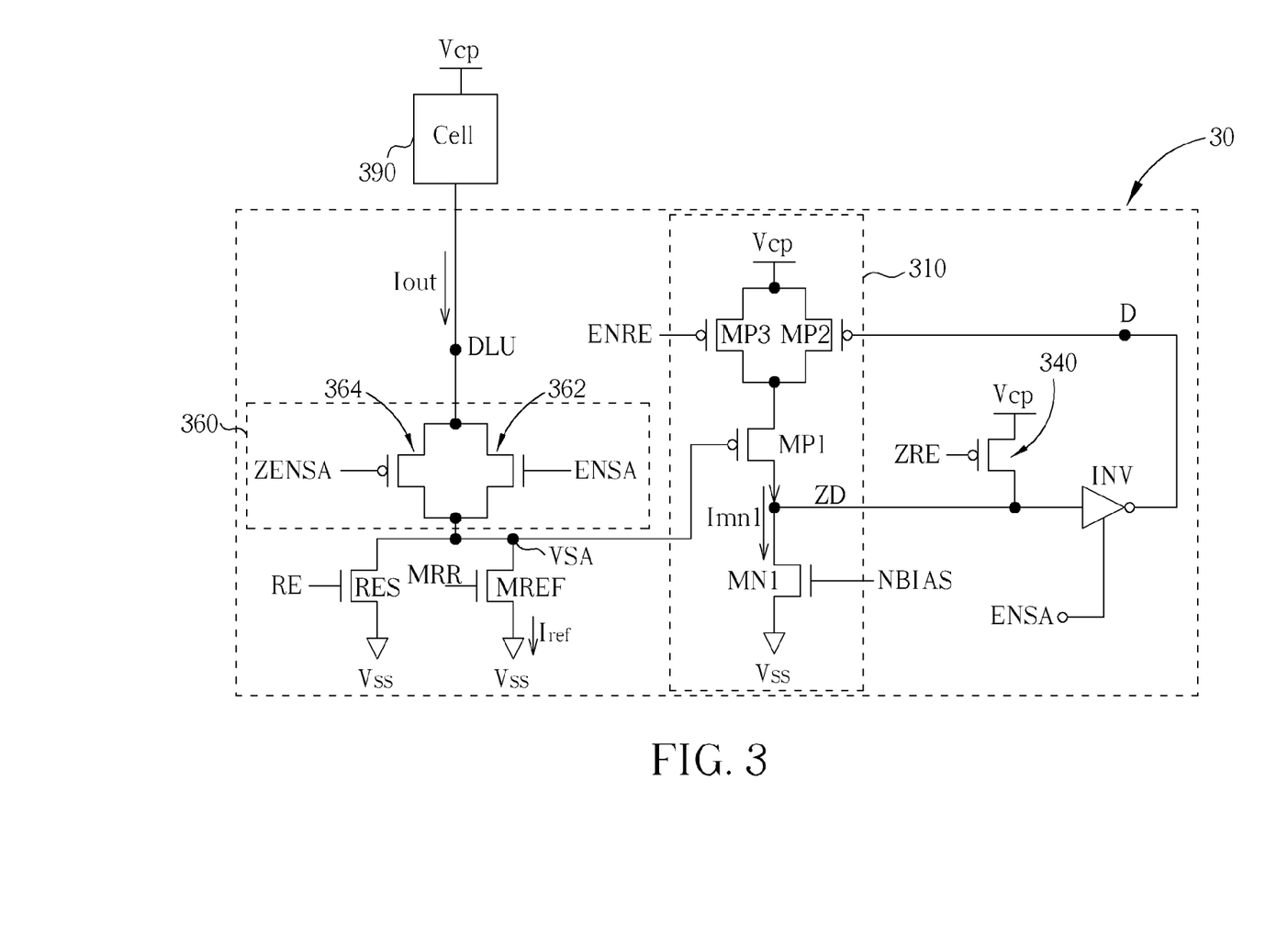
FIG. 3 illustrates a sensing circuit according to a first embodiment of the present invention.

Please refer to FIG. 3, which illustrates a sensing circuit 30 according to a first embodiment of the present invention. As shown in FIG. 3, the sensing circuit 30 includes an amplifier stage 310, an inverter INV, a reference transistor MREF, a reset transistor RES, a charging transistor 340, and a read enabling stage 360. Note that the reference transistor MREF is an N-type MOSFET, the reset transistor RES is an N-type MOSFET, and the charging transistor 340 is a P-type MOSFET. The sensing circuit 30 is connected to a memory cell 390 for sensing an output current of the memory cell 390, which is supplied with power from a voltage Vcp. The amplifier stage 310 includes a first P-type MOSFET MP1, a first N-type MOSFET MN1, a second P-type MOSFET MP2, and a third P-type MOSFET MP3. The first P-type MOSFET MP1 has a drain connected to a drain of the first N-type MOSFET MN1. The first P-type MOSFET MP1 has a source connected to both a drain of the second P-type MOSFET MP2 and a drain of the second P-type MOSFET MP3. The first N-type MOSFET MN1 has a source connected to ground, and has a gate connected to a reference signal NBIAS, which is generated by a reference circuit (not shown). The supplied voltage Vcp is connected to both sources of the second P-type MOSFET MP2 and the third P-type MOSFET MP3. The reference MOSFET MREF has a gate connected to a reference signal MRR, which is generated by the reference circuit (not shown), a source connected to ground, and a drain connected to a gate of the first P-type MOSFET MP1. The reset transistor RES has a gate connected to a reset signal RE, a source connected to ground, and a drain connected to the gate of the first P-type MOSFET MP1. Note that a node at the gate of the first P-type MOSFET MP1 is denoted as VSA. The inverter INV has an input terminal connected to the drain of the first P-type MOSFET MP1, and has an output terminal connected to a gate of the second P-type MOSFET MP2. The third P-type MOSFET MP3 has a gate connected to a signal ENRE. The charging transistor 340 has a drain connected to the drain of the first P-type MOSFET MP1, a gate connected to a signal ZRE, and a source connected to the supplied voltage Vcp. The read enabling stage 360 includes an N-type MOSFET 362 and a P-type MOSFET 364. Both a drain of the N-type MOSFET 362 and a source of the P-type MOSFET 364 are connected to the memory cell 390. Both a source of the N-type MOSFET 362 and a drain of the P-type MOSFET 364 are connected to the gate of the first P-type MOSFET MP1. A gate of the N-type MOSFET 362 is connected to a signal ENSA, and a gate of the P-type MOSFET 364 is connected to a signal ZENSA. Note that the signals ENSA and ZENSA are inverse to each other, and the signals RE and ZRE are inverse to each other as well. Note that a voltage Vss shown in FIG. 3 is used for indicating the ground. Note that a voltage at an output terminal of the memory cell 390 is denoted as a voltage DLU.

Functions of elements included by the sensing circuit 30 are introduced as follows. The read enabling stage 360 is used for enabling bit reading of the memory cell 390 while the memory cell 390 is under the program state or the erase state. At most times, the N-type MOSFET 362 and the P-type MOSFET 364 are switched on or switched off simultaneously by both the signals ENSA and ZENSA, and both the N-type MOSFET 362 and the P-type MOSFET 364 are switched on while a stored bit of the memory cell 390 is read. The reference transistor MREF is used for providing a reference current Iref so as to be compared with an output current Iout of the memory cell 390. Note that a magnitude of the reference current Iref varies with a magnitude of the signal MRR. The reset transistor RES is used for resetting the voltage DLU while the memory cell 390 is read since residual charge at the node indicated by the voltage DLU may affect the transition. While the signal RE is high, the reset transistor RES is switched on so that both the voltages VSA and DLU are reduced to ground. The first P-type MOSFET MP1 acts as a primary amplifier stage by taking the voltage VSA as its input. Note that a current of the first P-type MOSFET MP1 significantly depends on the magnitude of the voltage VSA because of a gate-to-source voltage difference of the first P-type MOSFET MP1. The first N-type MOSFET MN1 acts as a constant current source by introducing a current Imn1 shown in FIG. 3, where the reference signal NBIAS acts as a reading signal while the memory cell 390 is activated for reading its stored bit. Note that a node at the drain of the first P-type MOSFET MP1 is denoted as ZD so that a voltage at the node ZD is denoted as $V_{ZD}$, and therefore, the first N-type MOSFET MN1 also provides a path for the voltage $V_{ZD}$ to be grounded. The charging transistor 340 is used for charging the voltage $V_{ZD}$ while the signal ZRE is low, i.e., while the signal RE is high for resetting. Also note that the node at the output terminal of the inverter INV is denoted as D, which has a voltage $V_D$ inverse to the voltage $V_{ZD}$. An output signal of the sensing circuit 30 is just the voltage $V_D$. The voltage $V_D$ is fed at the gate of the second P-type MOSFET MP2 in a feedback manner, and the second P-type MOSFET MP2 acts as a latch for determining whether the voltage $V_D$ may reach the source of the first P-type MOSFET MP1 in a feedback manner. Note that a signal ENRE at the gate of the third P-type MOSFET MP3 is high while a loop including the first N-type MOSFET MP1, the inverter INV, and the second P-type MOSFET MP2. The signal ENRE is used for preventing power of the voltage Vcp from reaching the source of the first P-type MOSFET MP1 by switching off the third P-type MOSFET MP3 while the second P-type MOSFET MP2 is switched off as well, and additional power consumption at the voltage Vcp is saved as a result.

Figure 4:
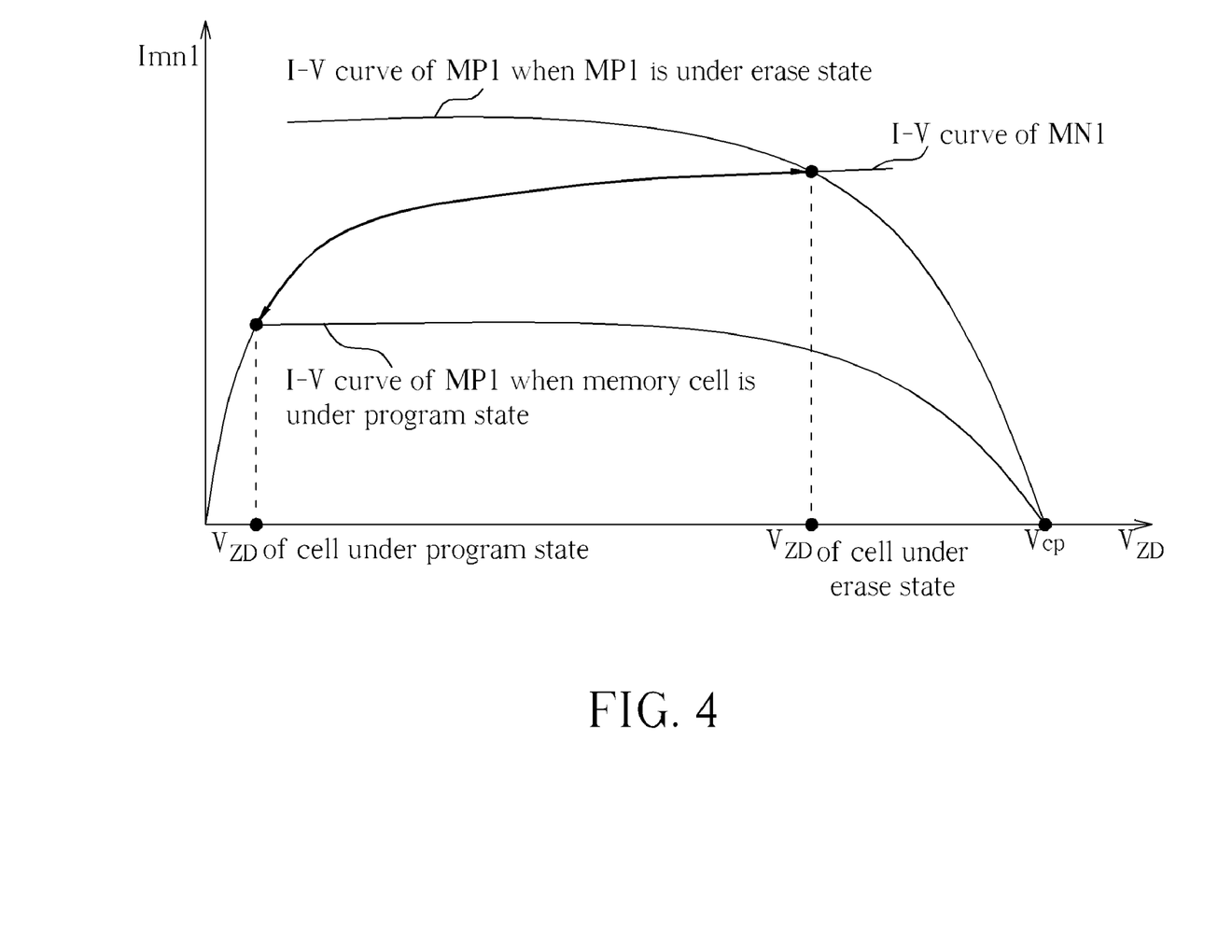
FIG. 4 illustrates a relation between the voltage $V_{ZD}$ and the current Imn1 shown in FIG. 3.

Please refer to FIG. 4, which illustrates a relation between the voltage $V_{ZD}$ and the current Imn1 shown in FIG. 3. As shown in FIG. 4, an I-V curve of the first P-type MOSFET MP1 under the program state, an I-V curve of the first P-type MOSFET MP1 under the erase state, and an I-V curve of the first N-type MOSFET MN1 are illustrated. Since the memory cell 390 outputs a larger current under the program state, and since the outputted current of the memory cell 390 is larger than the current of the reference transistor MREF, the voltage VSA is higher as a result of comparing currents with the reference transistor MREF; the first P-type MOSFET MP1 brings a smaller current in comparison with the current Imn1 and a lower voltage $V_{ZD}$ as a result, as shown in FIG. 4. Similarly, since the memory cell 390 outputs a smaller current under the erase state, the voltage VSA is lower, and the first P-type MOSFET MP1 brings a larger current in comparison with the current Imn1 and a higher voltage $V_{ZD}$ as a result, as shown in FIG. 4. An available range of the I-V curve of the first N-type MOSFET MN1 is determined according to intersections with both the I-V curves of the first P-type MOSFET MP1 under the program state and the erase state, as shown in FIG. 4.

Detailed operations of the sensing circuit 30 shown in FIG. 3 are described as follows in accordance with FIG. 3, FIG. 4, and FIG. 5. Please refer to FIG. 5, which illustrates waveforms of certain signals shown in FIG. 3.

While the signal ZENSA for enabling reading of the memory cell 390 is low at the beginning of the erase state, the signal RE is high for resetting the voltages VSA and DLU; the signal MRR drops from high to get stable, so as to generate a reference current Iref; meanwhile, the signal ZRE is low for charging the voltage $V_{ZD}$ to high in advance. After the resetting is over, the voltage VSA is slightly raised because of the low output current Iout when the memory cell 390 is under the erase state, so that the current of the first P-type MOSFET MP1 is larger than the current Imn1, and the voltage $V_{ZD}$ is kept high as a result. As mentioned before, the first N-type MOSFET MN1 acts as a constant current source having the current Imn1. Remind that since the resetting is over, the signal ZRE is high for switching off the charging transistor 340. Through the inverter INV, since the voltage $V_{ZD}$ is high now under the erase state, the voltage $V_D$ at the node D is low accordingly and indicates the erase state of the memory cell 390. The second P-type MOSFET MP2 is switched on with the low voltage $V_D$ so that the supplied voltage Vcp continuously charges the voltage $V_{ZD}$ until the reading of the memory cell 390 is over.

Figure 5:
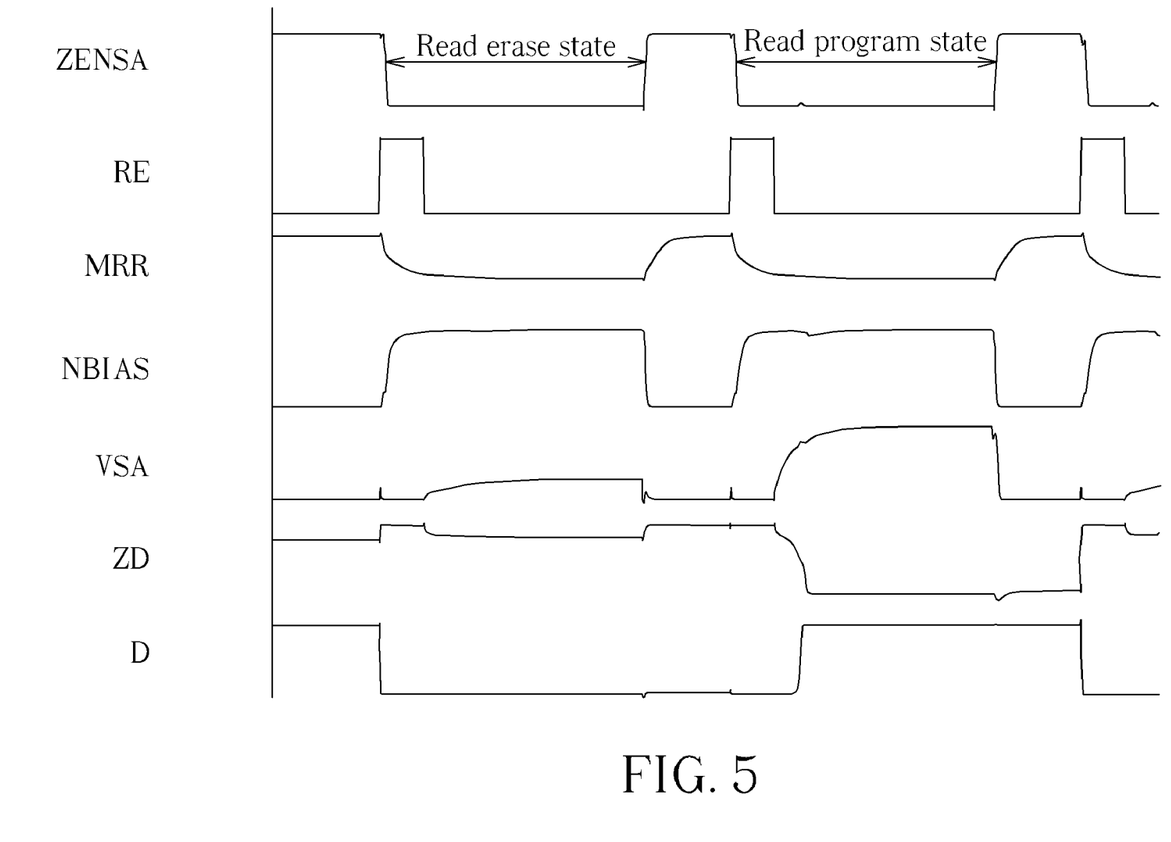
FIG. 5 illustrates waveforms of certain signals shown in FIG. 3.

As shown in FIG. 5, while the reading of the memory cell 390 is over, the reference signal NBIAS is turned to low for closing a loop including the first P-type MOSFET MP1, the second P-type MOSFET MP2, and the inverter INV, which is controlled by the signal ENSA, until the reading of the memory cell 390 is begun and the signal RE is turned to high. During the resetting, the signal RE is turned to high again to clear the residual charges at the nodes VSA and DLU, where the residual charge may be caused by a parasitic capacitance, and the signal ZRE is turned to low again to charge the node $V_{ZD}$ to close to Vcp as well. After the resetting is over, and when the memory cell 390 is under the program state, since the output current Iout is larger than it is under the erase state, the voltage VSA is higher as well. At this time, the current of the first P-type MOSFET MP1 is smaller than the current Imn1 so that the voltage $V_{ZD}$ tends to close to the voltage Vss, i.e., ground, if the signal ENRE is set to Vcp. Note that the charging transistor 340 is switched off after the resetting is over so that the voltage $V_{ZD}$ is pulled down through the first N-type MOSFET MN1. Similarly, the voltage $V_D$ is high at this time so that it indicates the program state of the memory cell 390, and therefore, the second P-type MOSFET MP2 is switched off for power saving under the program state.

Note that the third P-type MOSFET MP3 plays an optional role in the sensing circuit 30. The signal ENRE may be activated optionally. While the signal ENRE is high, the third P-type MOSFET MP3 is switched off for saving power under the program state. While the signal ENRE is low, the third P-type MOSFET MP3 is switched on for continuously supplying currents for the first P-type MOSFET MP1 so that the feedback loop including the first P-type MOSFET MP1, the inverter INV, and the second P-type MOSFET MP2, is broken.

Figure 6:
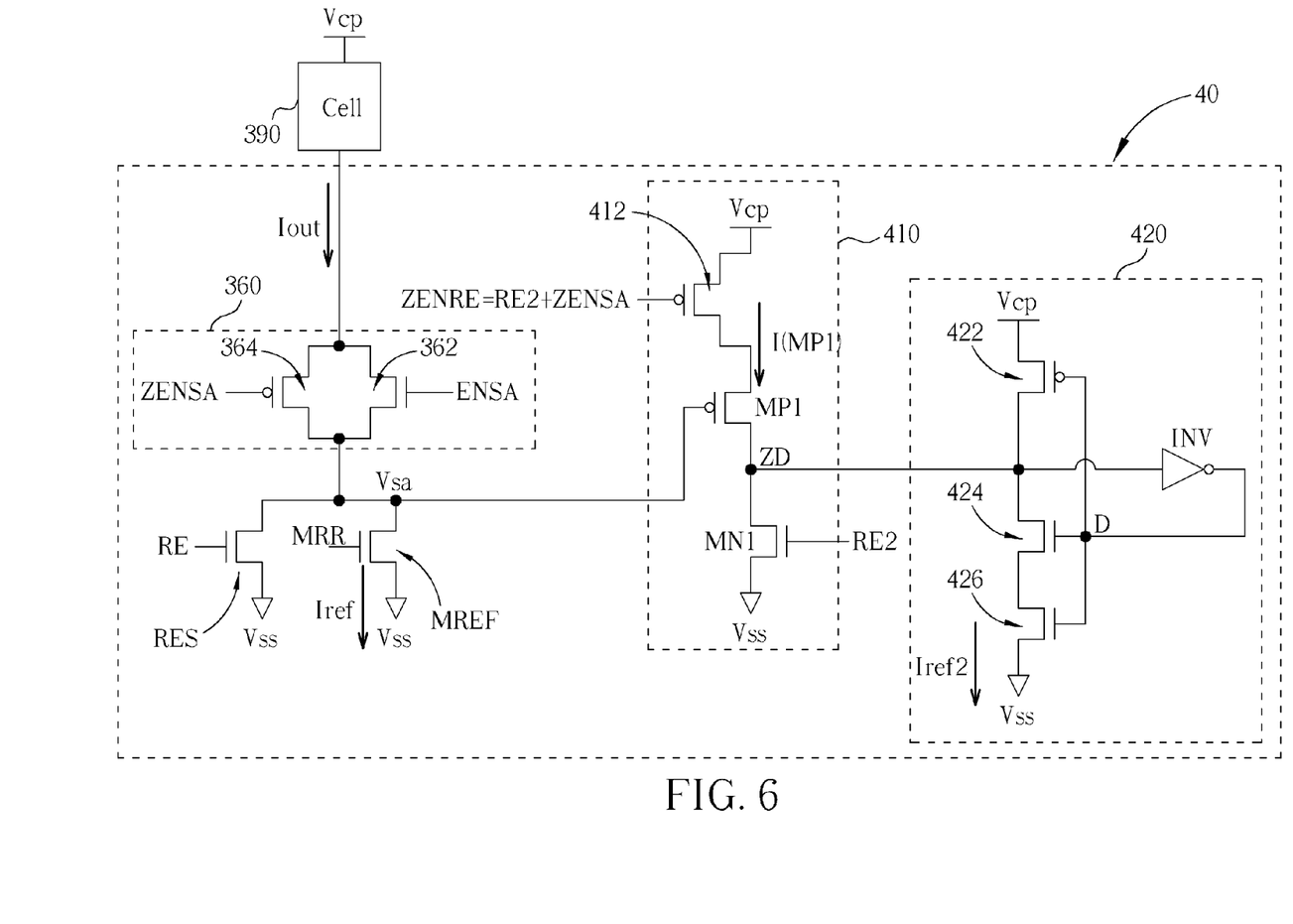
FIG. 6 illustrates a sensing circuit for a memory cell according to a second embodiment of the present invention.

Please refer to FIG. 6, which illustrates a sensing circuit 40 for a memory cell according to a second embodiment of the present invention. As shown in FIG. 6, the sensing circuit 40 includes a first stage 410, a second stage 420, the reference transistor MREF, the reset transistor RES, the N-type MOSFET 362, and the P-type MOSFET 364. The first stage 410 includes the first P-type MOSFET MP1, the first N-type MOSFET MN1, and a second P-type MOSFET 412. The second stage 420 includes a second N-type MOSFET 424, a third N-type MOSFET 426, a third P-type MOSFET 422, and the inverter INV. The sensing circuit 40 is used for sensing the output current Iout of the memory cell 390 to distinguish the program state and the erase state of the memory cell 390. Repeated connections of the sensing circuit 40 in aspects of the sensing circuit 30 shown in FIG. 3 is not described repeatedly. In the first stage 410, the gate of the first N-type MOSFET MN1 is connected to a reset signal RE2, a node ZD having a voltage $V_{ZD}$ is located at the drain of the first P-type MOSFET MP1, and a gate of the second P-type MOSFET 412 is connected to a control signal ZENRE, which is a result of performing logic OR on the signals RE2 and ZENSA. Note that the second P-type MOSFET 412 has a drain connected to the source of the first P-type MOSFET MP1, and has a source connected to the supplied voltage Vcp. In the second stage 420, the third P-type MOSFET 422 has a source connected to the supplied voltage Vcp, a drain of the third P-type MOSFET 422 is connected to both the drain of the first P-type MOSFET MP1 and the input terminal of the inverter INV, and a gate connected to the output terminal of the inverter INV. The second N-type MOSFET 424 has a drain connected to the drain of the third P-type MOSFET 422, and a gate connected to the output terminal of the inverter INV. The third N-type MOSFET 426 has a drain connected to a source of the second N-type MOSFET 424, a gate connected to the output terminal of the inverter INV, and a source connected to the voltage Vss, i.e., ground. Note that a node at the gate of the third P-type MOSFET 422 is denoted as D, a voltage at the node D is denoted $V_D$, which is the output signal of the sensing circuit 40 for indicating the program state and the erase state of the memory cell 390.

Figure 7:
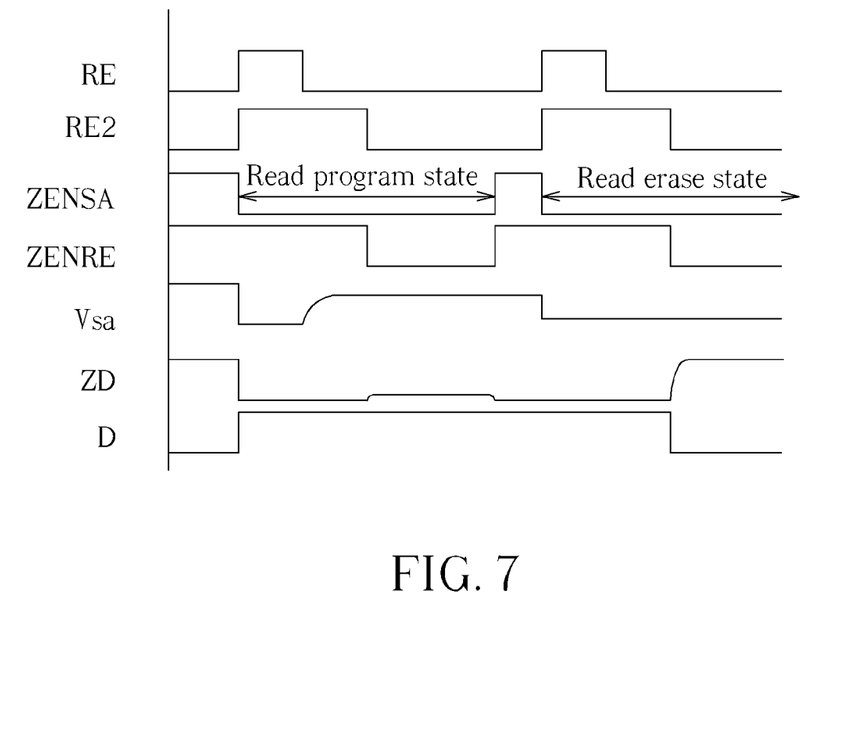
FIG. 7 illustrates waveforms of certain signals shown in FIG. 6.

Detailed operations of the sensing circuit 40 are described as follows. Please refer to FIG. 7, which illustrates waveforms of certain signals shown in FIG. 6. The signal RE is used for resetting the voltage Vsa. The signal RE2 is used for resetting the voltage $V_{ZD}$ at the node ZD. The resetting of the sensing circuit 40 has two stages corresponding to the reset signals RE and RE2 respectively. As can be observed from lengths of the reset signals RE and RE2 shown in FIG. 7, while the sensing circuit 40 is resetting, in the first stage, the voltage Vsa is reset by activating the reset transistor RES according to the reset signal RE; in the second stage, since the voltage Vsa is reset to low and stable, the voltage $V_{ZD}$ is low in accordance under the condition that a second P-type MOSFET 412 is switched off by the activated control signal ZENRE, where either one of the signals RE2 and ZENSA is high during the resetting, and the voltage $V_{ZD}$ is reset by the switching on first N-type MOSFET MN1 by the activated reset signal RE2. Therefore, the voltage $V_{ZD}$ is ensured to be completely cleared during the resetting, and the voltage Vsa is ensured to be stable before the end of the resetting stage. Moreover, with the aid of both the second P-type MOSFET 412 and the control signal ZENRE, power consumption of the sensing circuit 40 is significantly reduced during the resetting of the sensing circuit 40.

While the memory cell 390 is under the erase state, the output current Iout of the memory cell 390 is lower than the reference current Iref so that the voltage Vsa is low as well. The current of the first P-type MOSFET MP1 is larger as a result of the low voltage Vsa. The voltage $V_{ZD}$ is getting high since the current I(MP1) is larger than the current Iref2. At this time, because the voltage $V_{ZD}$ is high, the output voltage $V_D$ of the sensing circuit 40 is low for indicating the erase state. As a result, since the voltage $V_D$ is low, both the second and third N-type MOSFET 424 and 426 are switched off, and the third P-type MOSFET 422 is switched on for maintaining the low voltage of the voltage $V_D$.

While the memory cell is under the program state, the output current Iout of the memory cell 390 is higher than the reference current Iref so that the voltage Vsa is high as well. The current of the first P-type MOSFET MP1 is smaller as a result of the high voltage Vsa. The voltage $V_{ZD}$ is getting low since the current I(MP1) is smaller than the current Iref2. At this time, because the voltage $V_{ZD}$ is low, the output voltage $V_D$ of the sensing circuit 40 is high for indicating the program state. As a result, since the voltage $V_D$ is high, both the second and third N-type MOSFET 424 and 426 are switched on for providing a reference current Iref2 shown in FIG. 6, and the third P-type MOSFET 422 is switched off for maintaining the low voltage of the voltage $V_D$.

With the aid of both the embodiments disclosed above, merely an output current of a memory cell is required to be sensed for distinguishing the state of the memory cell, i.e., the program state or the erase state. Therefore, both the sensing circuits 30 and 40 do not meet restrictions about an insufficient voltage difference of used transistors mentioned in the prior art. In other words, the sensing circuit disclosed in the present invention may also be used for low supplied power of the memory circuit without being unable to distinguish the program state and the erase state accurately. Moreover, the sensing circuit 30 is designed to save power under the program state, whereas the sensing circuit 40 is designed to save power when the sensing circuit 40 is reset with some critical voltages for distinguishing the modes.

Those skilled in the art will readily observe that numerous modifications and alterations of the device and method may be made while retaining the teachings of the invention.

What is claimed is:

1. A sensing circuit for a memory cell supplied with low power, comprising:
    a sensing stage, comprising:
    a first P-type MOSFET having a gate connected to a memory cell for receiving an output current of the memory cell;
    a first N-type MOSFET having a drain connected to a drain of the first P-type MOSFET, and having a source connected to ground; and
    a second P-type MOSFET having a drain connected to a source of the first P-type MOSFET, having a gate connected to an output terminal of the inverter, and having a source connected to a supplied voltage;
    an inverter having an input terminal connected to the drain of the first N-type MOSFET; and
    a reference transistor having a gate connected to a reference signal, and having a drain connected to the gate of the first P-type MOSFET;
    wherein a voltage at the output terminal of the inverter is used for indicating a program state or an erase state of the memory cell;
    wherein a current flowing through the first N-type MOSFET is compared with a current flowing through the first P-type MOSFET;
    wherein a current of the reference transistor is compared with a current generated from the memory cell.

2. The sensing circuit of claim 1 further comprising:
    a third P-type MOSFET having a drain connected to the drain of the second P-type MOSFET, a gate connected to an optional signal, and a source connected to the supplied voltage;
    wherein the optional signal is configured to enable a feedback loop in reading the memory cell with the program state.

3. The sensing circuit of claim 1 further comprising:
    a reset transistor having a gate connected to a reset signal, having a drain connected to the gate of the first P-type MOSFET, and having a source connected to ground; and
    a charging transistor having a source connected to the supplied voltage, having a gate connected to an inverse reset signal, and having a drain connected to the drain of the first P-type MOSFET;
    wherein a source of the reference transistor is connected to ground;
    wherein the inverse reset signal indicates an inverse voltage of the reset signal;
    wherein the reset signal is used for controlling the reset transistor to reset a voltage at the gate of the first P-type MOSFET;
    wherein the reference signal is used for controlling a magnitude of a current flowing through the reference transistor;
    wherein the inverse reset signal is used for controlling the charging transistor to charge a voltage at the drain of the first P-type MOSFET while the voltage at the gate of the first P-type MOSFET is reset by the reset signal; and
    wherein both the reference transistor and the reset transistor are N-type MOSFETs, and the charging transistor is a P-type MOSFET.

4. The sensing circuit of claim 1 further comprising:
    a second N-type MOSFET having a gate connected to a read enabling signal, having a drain connected to the memory cell, and a source connected to the gate of the first P-type MOSFET; and
    a fourth P-type MOSFET having a gate connected to an inverse of the read enabling signal, having a drain connected to the gate of the first P-type MOSFET, and having a source connected to the drain of the second N-type MOSFET;
    wherein while reading the memory cell, the read enabling signal is high, and the inverse of the read signal is low.

* * * * *